(12) United States Patent
Hiew et al.

(10) Patent No.: US 10,197,599 B2
(45) Date of Patent: Feb. 5, 2019

(54) TEST PIN CONFIGURATION FOR TEST DEVICE FOR TESTING DEVICES UNDER TEST

(71) Applicant: Infineon Technologies AG, Neubiberg (DE)

(72) Inventors: Fu San Hiew, Melaka (MY); Siao Kiat Tan, Melaka (MY); Wee Kuan Tan, Melaka (MY); Arieff Ridzwan Yussuff, Perak (MY); Murad Hudda, Austin, TX (US); Wang Xiaojun, Singapore (SG); Ge Dandong, Singapore (SG); Yusman Sugianto, Singapore (SG); Tay Chyeo Yong, Singapore (SG); Lee Chow York, Singapore (SG); Gan Swee Lee, Singapore (SG)

(73) Assignee: Infineon Technologies AG, Neubiberg (DE)

( * ) Notice: Subject to any disclaimer, the term of this patent is extended or adjusted under 35 U.S.C. 154(b) by 299 days.

(21) Appl. No.: 14/970,868

(22) Filed: Dec. 16, 2015

(65) Prior Publication Data

US 2017/0176494 A1 Jun. 22, 2017

(51) Int. Cl.
*G01R 31/28* (2006.01)
*G01R 1/067* (2006.01)

(52) U.S. Cl.
CPC ..... *G01R 1/06738* (2013.01); *G01R 31/2886* (2013.01)

(58) Field of Classification Search
CPC .............. G01R 1/07307; G01R 1/07342
See application file for complete search history.

(56) References Cited

U.S. PATENT DOCUMENTS

| 5,391,082 | A | 2/1995 | Airhart | |
| 6,222,377 | B1* | 4/2001 | Kato | G01R 1/06722 324/750.25 |
| 6,291,897 | B1 | 9/2001 | Wark et al. | |
| 6,650,131 | B2 | 11/2003 | Campbell et al. | |
| 2004/0113603 | A1* | 6/2004 | Fink | G01D 11/30 324/72.5 |
| 2008/0180125 | A1 | 7/2008 | Lee | |
| 2008/0238463 | A1* | 10/2008 | Takabe | G01R 31/2891 324/762.06 |
| 2010/0253374 | A1* | 10/2010 | Chen | G01R 31/31905 324/756.03 |
| 2014/0158416 | A1 | 6/2014 | Oh et al. | |

FOREIGN PATENT DOCUMENTS

JP 2001116765 A * 4/2001

OTHER PUBLICATIONS

Ingun GmbH, Kontaktstifte Katalog 2010/2011, Konstanz, 2011, p. 20.—Firmenschrift.

* cited by examiner

*Primary Examiner* — Tung X Nguyen

(57) ABSTRACT

A test pin for a test device for electrically contacting a device under test to be tested, wherein the test pin comprises an electrically conductive base structure for electrically conducting a test signal between the device under test and the test device, and an exchangeable electrically conductive pin tip body configured to directly contact the device under test and to be exchangeably assembled with the base structure.

18 Claims, 4 Drawing Sheets

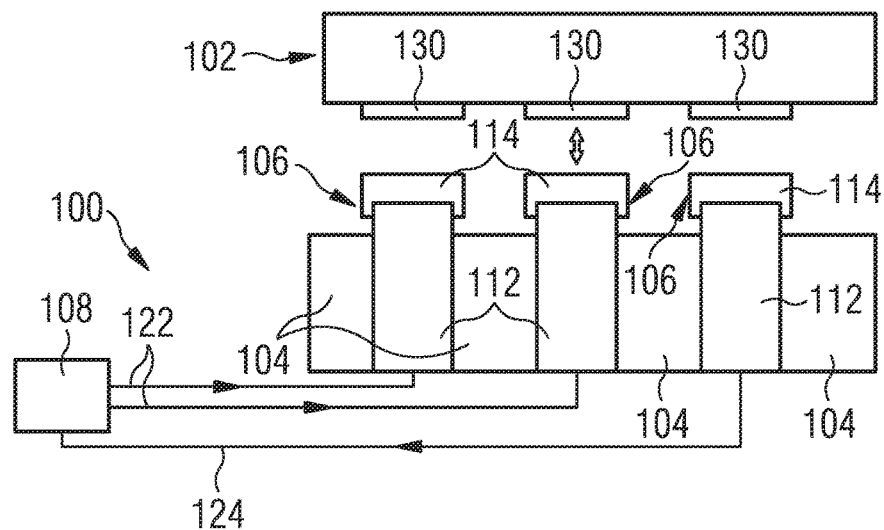
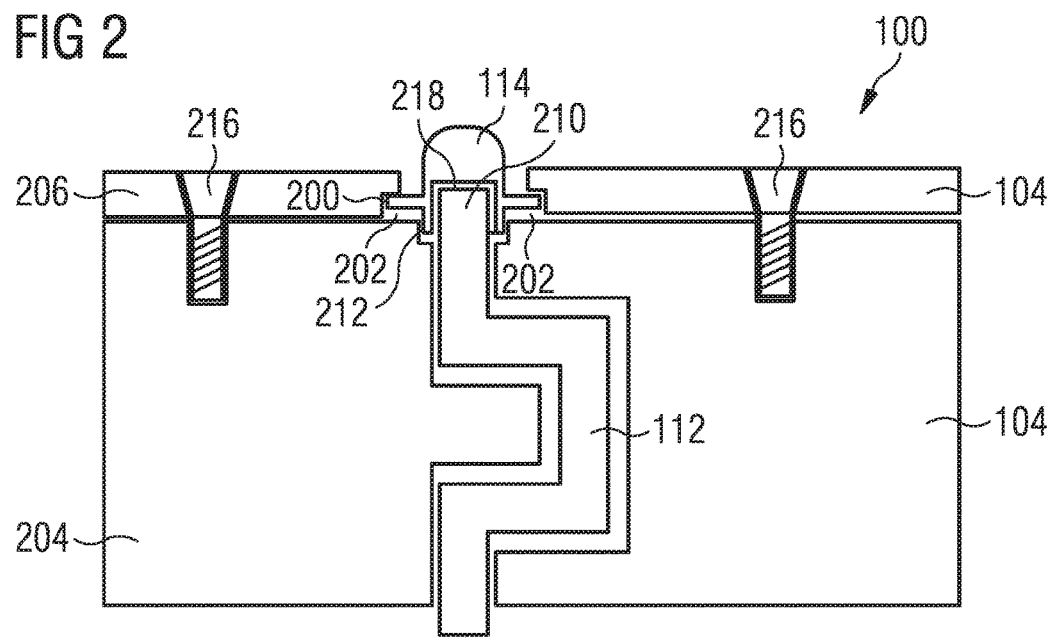

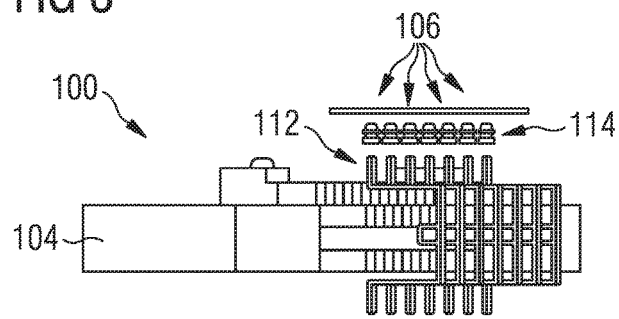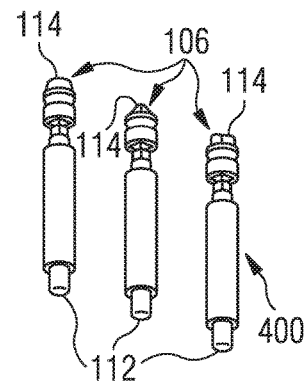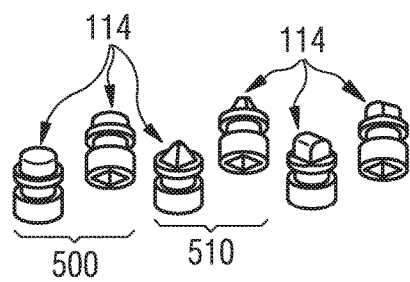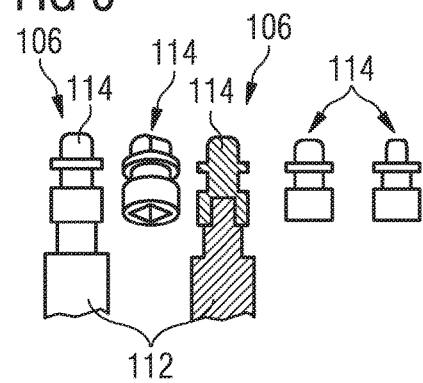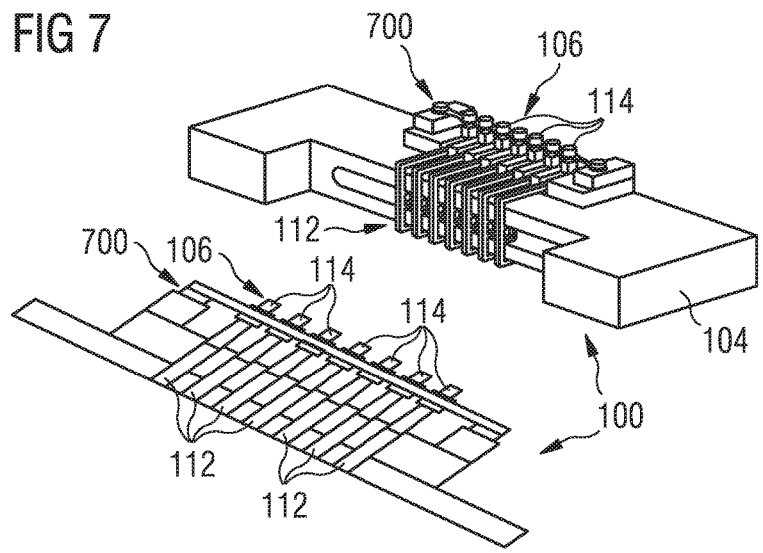

TEST PIN CONFIGURATION FOR TEST DEVICE FOR TESTING DEVICES UNDER TEST

BACKGROUND

Technical Field

Various embodiments relate generally to test pins, a test device, and methods of testing a device under test.

Description of the Related Art

After completing manufacture of semiconductor chips or packages of such semiconductor chips, such IC (integrated circuit) devices are usually tested concerning their function. For this purpose, a test device with one or more test pins is provided in which such products are tested as devices under test (DUT).

However, the technical effort required for such tests is significant, because test pins suffer from wear and need to be exchanged frequently in a cumbersome and time-consuming procedure. Moreover, the reliability and correctness of test results (i.e. the reliability that a DUT having passed the test is in fact acceptable and that a DUT having failed the test is in fact unacceptable) is still improvable.

SUMMARY

There may be a need for a system for testing a device under test with reasonable effort.

There may also be a need for a system for testing a device under test with a high reliability of the test result.

According to an exemplary embodiment, a test pin for a test device for electrically contacting a device under test to be tested is provided, wherein the test pin comprises an electrically conductive base structure for electrically conducting a test signal between the device under test and the test device, and an exchangeable (or substitutable) electrically conductive pin tip body configured to directly (or physically) contact the device under test and to be exchangeably assembled with the base structure.

According to another exemplary embodiment, a test pin for a test device for electrically contacting a device under test to be tested is provided, wherein the test pin comprises an electrically conductive base structure for electrically conducting a test signal between the device under test and the test device, and a pin tip (which may be integrally formed with the base structure or which may be separable therefrom) configured as wedge-shaped end portion (which may be a section of hard material tapered to a thin edge, or a section of hard material with two principal faces meeting in a sharp angular end) of the test pin and to directly contact the device under test for conducting the test signal between the device under test and the base structure.

According to yet another exemplary embodiment, a test device for electrically testing a device under test (such as an integrated circuit (IC) device) is provided, wherein the test device comprises a housing, at least one test pin having the above-mentioned features assembled with the housing and configured for electrically contacting a device under test for conducting a test signal from or to the device under test.

According to yet another exemplary embodiment, a method of testing a device under test is provided, wherein the method comprises directly contacting a test pin body of a test pin having the above-mentioned features with an electrically conductive structure of the device under test, applying a test signal via the electrically conductive base structure and the test pin body to the electrically conductive structure of the device under test as a stimulus, detecting a response of the device under test to the test signal, and disassembling (in particular after having repeated the procedures of contacting, applying and detecting a plurality of times) the exchangeable pin tip body from the base structure and assembling another exchangeable electrically conductive pin tip body with the same base structure.

According to yet another exemplary embodiment, a method of testing a device under test is provided, wherein the method comprises directly contacting a wedge-shaped end portion of a test pin having the above-mentioned features with an electrically conductive structure of the device under test, applying a test signal via the electrically conductive base structure and the wedge-shaped end portion to the electrically conductive structure of the device under test as a stimulus, and detecting a response of the device under test to the test signal.

According to yet another exemplary embodiment, a test pin having the above-mentioned features, a test device having the above-mentioned features, or a method having the above-mentioned features is used for testing a power package as device under test, in particular a power package comprising at least one power semiconductor chip (for instance having one or more Insulated Gate Bipolar Transistors, IGBT).

According to an exemplary embodiment, a test device for testing electrically conductive devices under test is provided in which an electric test signal (such as a stimulus stimulating the DUT and/or a response signal generated by the DUT in response to a stimulus) is transported by a test pin made of two (or more) separable physical structures. A base structure can form a main part of the test pin in terms of size and weight and may remain part of the test device for a long term. In contrast to this, a pin tip body being substitutably connected to the base structure may be a physically smaller member which can be easily connected with or deconnected from the base body and which accomplishes a direct physical contact between the test device and the DUT. Thus, the pin tip body may be flexibly brought in direct contact with different devices under test one after the other for respectively testing a DUT being presently in contact with the pin tip body. In view of the frequently changing physical contacts made between the pin tip body and the various electrically conductive structures of the DUTs, the pin tip body is prone to wear. In view of the exchangeable or substitutable configuration of the pin tip body with regard to the base structure, it is however possible to re-use the major part of the test pin at the test device so that only the specific element or portion of the test pin being exerted to mechanical wear needs to be exchanged, i.e. the pin tip body. This allows for an efficient use of resources, reduces the amount of waste and saves costs in terms of testing DUTs. Furthermore, the exchange of an exposed worn out pin tip body mounted in a housing is easier than the exchange of the entire test pin, since it is sufficient to temporarily disassemble only a part of the housing for exchanging the pin tip body while it is necessary to completely disassemble the housing for changing the entire test pin. The exchange procedure is hence significantly faster when implementing the concept of a separable pin tip body.

According to another exemplary embodiment, a wedge-shaped pin tip is provided as an end portion of a test pin for testing devices under test. It has turned out that such a wedge-type end of a test pin provides for a highly reliable electric contact with an electrically conductive structure (such as a chip pad, an electrically conductive trace, etc.) of a DUT. Without wishing to be bound to a specific theory, it is presently believed that the wedge-shaped geometry of the pin tip with a tapering end line defines a sharp cutting edge capable of exerting a contact force in a spatially highly concentrated manner on the electrically conductive structure of the DUT so that the wedge-shaped pin tip may cut through frequently occurring oxide layers on electrically conductive surfaces of a DUT which improves the electrical contact between DUT and test device. Such an oxide layer may have dielectric properties and may artificially prevent a proper electric coupling between test pin and DUT in conventional geometries. However, when a knife-like pin tip is implemented according to exemplary embodiments, the reliability of test results may be significantly improved since properly working DUTs are no longer rejected erroneously as a consequence of an artificially poor electric contact between test pin and electrically conductive structures of the DUT. Thus, the average correctness of the test result, i.e. the true classification of a specific DUT having passed or having failed the test, can be increased. Thus, a quality test of DUTs may be performed more reliably and faster.

It should be said that the first above-mentioned aspect (exchangeable pin tip body) and the second above-mentioned aspect (wedge-shaped pin tip) of the invention can be used separately or may be freely combined. For example, a test pin composed of base structure and exchangeable pin tip body may be provided with a wedge shape of the pin tip body or with any other tip shape allowing to still maintain the advantage of low maintenance efforts of the test pin in view of wear. Correspondingly, the wedge-shaped geometry of a pin tip of a test pin may be implemented with a two-piece test pin, i.e. a test pin configured of base structure and separately exchangeable or separable pin tip body, or may be implemented with an integral structure of a test pin from a single body. Even the latter alternative still allows to maintain the advantage of a reliable electric contactability between an end line of the wedge-shaped end portion and an electrically conductive structure of a DUT. More specifically, all embodiments described herein with regard to the aspect of a substitutable or exchangeable pin tip body may also be implemented in terms of a wedge-shaped ended test pin. Correspondingly, all embodiments described herein with regard to a test pin with a wedge-shaped end portion may also be implemented in an embodiment in which a test pin is composed of a base structure and a substitutable or exchangeable separate pin tip body.

DESCRIPTION OF FURTHER EXEMPLARY EMBODIMENTS

In the following, further exemplary embodiments of the test pins, the test devices, and the methods will be explained.

In the context of the present application, the term "device under test" (DUT) may particularly denote an electronic component such as a semiconductor package which shall be tested concerning its desired functionality after manufacture. In particular, the device under test may be an electronic member configured as a power semiconductor, in particular for automotive applications. Such devices under test may require an electric test involving the application of high voltage and/or high current electric test signals (for instance applying a current of up to 100 Ampere).

In the context of the present application, the term "exchangeable pin tip body" may particularly denote a physical structure which can be provided as a separate body with regard to a base structure. Thus, exchange or substitution may be carried out without destroying the two piece test body. On the other hand, exchangeability of the pin tip body implies that the pin tip body can be connected to the base structure in a way that, upon connection, a proper mechanical and electrical connection between base structure and pin tip body is established meeting the requirements to use the resulting test pin for testing devices under test even under the harsh conditions of a high throughput industrial application. Exchangeability of the test pin body with regard to the base structure may be so that a robot or an operator can simply detach the test pin body from the base structure for instance by exerting an actual pulling force on the test pin body with regard to the base structure, by screwing, etc. In one embodiment, the exchangeable pin tip body may be an exchangeable pin tip plunger.

In the context of the present application, the term "wedge-shaped" pin tip may particularly denote a pin tip geometry in which the pin tip body or portion tapers towards a tip end so as to result in a substantially one-dimensional end line. In particular, such an end line of a wedge-shaped body may be straight or linear, although it may also be curved. When the end line of the wedge-shaped body is curved (for instance in a concave and/or convex manner), the length of the contact line between the pin tip and the lead may be elongated, which may result in a better reliability. For instance, the end line may be curved in a nail shape. Although it is preferred that this end line has a very narrow width to promote a capability of the pin tip to protrude through an oxide layer covering an electrically conductive structure of an electric contact of the DUT to be tested, it is of course possible that the end line of the wedge-shaped pin tip has a certain physical width as long as the reliable electric contacting of the electrically conductive structures of the DUT is maintained.

In an embodiment, the pin tip body and the base structure are configured to be assembled by a form closure and/or by force transmission by friction. Thus, the reliable mechanical and electrical connection between base structure and pin tip body may be guaranteed by a corresponding shape of pin tip body and base structure, as can be achieved for instance by a nut and groove configuration. It has turned out as a powerful mechanism, in terms of low abrasion and wear as well as in terms of establishing a proper conductive path, when the connection portion of the pin tip body is configured as a cup-shaped portion or interface cooperating with a full material end portion of the base structure. However, these two geometries can also be exchanged. Additionally or alternatively to the provision of a form closure between pin tip body and base structure, it is also possible that the connection between these two elements is accomplished by friction. In such a configuration, the pin tip body and the base structure may be simply plugged together and remain connected by a press-fit between them.

In an embodiment, the pin tip body is configured to be (in particularly axially) plugged on the base structure. With such a plugging connection architecture, it is possible that the pin tip body is attached to or detached from the base structure by a merely axial plugging or unplugging motion. Such a configuration can be easily implemented in terms of an automated exchange of the pin tip body. Alternatively, assembling or disassembling of the pin tip body with regard to the base structure may also be accomplished by a turning motion, for instance for establishing a screwing connection between an internal thread of the pin tip body and an external thread of the base structure, or vice versa.

In an embodiment, the pin tip body comprises a (for example annular) collar configured to be accommodated in a recess formed between two members of a housing of the test device. In this way, it may become possible to captively assemble the test pin at the housing, i.e. to assemble them without the risk that the pin tip body is lost by falling off from the base structure. By equipping the pin tip body with a collar, mounting of the pin tip body with regard to the base structure may hence be performed in a way that undesired separation between pin tip body and base structure during use of the test device can be safely prevented. In such a configuration, exchange of the pin tip body can be accomplished by temporarily disassembling the two housing members. The worn out pin tip body may then be removed from the respective base structure by simply detaching it therefrom. A new pin tip body may then be attached to the base structure so that the collar of the new test pin body is accommodated within an accommodation recess between the housing members. By subsequently assembling the other housing member on the before mentioned housing member with the new pin tip body partially sandwiched between the housing members, the test device is ready for new tests. The collar safely disables removal of the test pin from the housing without disassembly of the upper housing member. A recess or accommodation space in the upper housing member may accommodate the collar. In an embodiment, the collar can be configured as a laterally protruding section of the test pin body, i.e. may constitute a laterally or radially outermost end of the pin tip body. In such a configuration, even a small coupling force between base structure and pin tip body can be sufficient to ensure reliable connection of this two-piece test pin during operation.

In an embodiment, the base structure is configured as a cantilever or a pogo pin. In a cantilever architecture, an angled base structure is implemented, wherein the pin tip body is attached to an end of this angled structure. The cantilever, which may have an intrinsic spring-function, may then exert a pressing force on the test pin against the electrically conductive structure of the DUT. A pogo pin may be equipped with an integrated spring so that pressing the test pin against the counter-surface of the electrically conductive structure of the DUT may compress the spring which will have the tendency to move back into the equilibration position. More generally, the test pin may have an integrated biasing mechanism, either implemented in the base structure or in the pin tip body or in both, for improving the physical and electrical contact with the electrically conductive structure of the DUT.

In an embodiment, the separable pin tip body may be a wedge-shaped pin tip body, a crown-shaped pin tip body, a rounded pin tip body, etc. With all these configurations and geometries, it is possible to obtain a more efficient use of resources with the two piece configuration of the test pins. However, particularly preferred is a wedge-shaped geometry of the pin tip body at its distal end at which the test pin physically contacts the electrically conductive structure of the DUT. Firstly, such a configuration has the advantage that even with moderate contact forces, a reliable electric contact between test pin and DUT is possible. Secondly, the geometry of a tapering configuration towards the contact line allows to configure the proximal end of the pin tip body with a sufficient thickness so that a reliably mechanical and electrical connection between test pin body and base structure is enabled.

In an embodiment, the wedge-shaped end portion comprises an end line configured at knife edge, i.e. as a sharp cutting edge. When configuring the end line as a knife edge, it is possible that even with moderate contact forces between test pin and electrically conductive structure of DUT, the knife edge cuts through a possible oxide layer on top of (oxidized) electrically conductive material of the electrically conductive structure of the DUT and thereby guarantees a reliable electric connection between test pin and DUT. In such a configuration of the end line as a knife edge, a cutting action can be performed during the contacting, which can furthermore be promoted with a biasing mechanism (such as a spring mechanism) implemented in the test pin (in particular in the base structure thereof).

In an embodiment, the wedge-shaped end portion comprises two slanted first walls tapering towards an end line. The two slanted walls may be planar and non-parallel. This allows to obtain a one-dimensional rather than zero-dimensional contact end with a preferably straight end line geometry.

In an embodiment, an angle between the two slanted first walls is in a range between 60° and 100°. If the angle would be significantly smaller than 60°, this could cause mechanical instabilities at the distal end line of the test pin and a pronounced amount of wear. If the angle would be significantly larger than 100°, it may become difficult to cut through a thin dielectric oxide layer covering an electrically conductive surface of the electrically conductive structure of the DUT, thus rendering the reliability of the electrical contact doubtful. A particularly preferred angular range in view of the above considerations may be a range between 70° and 90°.

In an embodiment, the wedge-shaped end portion comprises two second walls (which may be planar) extending in parallel to one another.

The two second walls can be substantially parallel to one another (i.e., vertical upward) to have a long linear region at the top of the pin tip. This provides for a very reliable electric contact. However, it is also possible that the two second walls are somewhat inclined, to form a shorter linear at the top.

The second walls extending in parallel to one another ensure, in particular in combination with the above-described first walls with their slanted configuration, a protection against undesired rotation of the test pin during operation. In other words, the edges between adjacent walls can provide an anti-rotation function. Besides that, this function can be implemented by a corresponding (in particular non-around) shape of the base (compare FIG. 9 and FIG. 10).

Advantageously, the two second walls extend vertically or at least substantially vertically. This has the advantage that the length of the top of the pin tip can be longer compared with the inclined sidewalls of the first walls, like a cone shaped tip. This has benefits in view of the limited space of the base holding the pin tip.

In one embodiment, the mentioned sidewall can be composed as two parallel walls. It is however also possible that it is configured as one wall only, for instance when a very tiny pin is desired.

In an embodiment, the test device comprises a control unit configured for applying the one or more electric test signals via one or more test pins to the device under test as one or more electric stimulus signals and detecting one or more electric response signals from the device under test in response to the one or more test signals via one or more test pins. Such a control unit may control overall operation of the test device. In particular, such a control unit (for instance a processor) may generate and apply one or more electric test signals to the one or more base structures of the one or more pins. Such an electric test signal may propagate to the pin tip (for instance a separate pin tip body) and can then be applied (preferably via a wedge-shaped end tip) to a corresponding electrically conductive structure of the DUT. After having applied the one or more test signals to the DUT, they will be processed by the DUT in accordance with the electronic functionality of the DUT. As a result of this signal processing, one or more response signals are generated in response to the applied test signal(s). These one or more response signals can be transmitted electrically from the electrically conductive structure(s) of the DUT via test pin(s) to the control unit. Based on the response signal, the control unit can determine as to whether the presently analyzed DUT has passed or failed the test (which may be a full function test). In view of the two part configuration of the test pins, the frequent contacting of the test pins with electrically conductive contacts of the various DUTs, resulting in wear, can be overcome by exchanging only the pin tip bodies rather than the entire test pins. By configuring the end of the pin tips as wedge-shaped structures, a reliable electric connection with the electrically conductive contacts of the DUTs may be accomplished, event in the event of an oxidation of the surface of the DUT.

In an embodiment, the housing and the at least one test pin are matched to one another so that rotation of the at least one test pin relative to the housing is disabled. Thus, the test pin can be fixed to one location and one orientation which results in a better contact angle and, more generally, a better contactability.

In an embodiment, the test device comprises a plurality of test pins having the above-mentioned features whose pin tip bodies are connected with one another via a handling body for interaction with the housing to exchange the plurality of pin tip bodies simultaneously. Such a handling body may be a stripe, for instance an elastomer stripe, and simplifies handling a plurality of pin tip bodies to be exchanged at the same time.

In an embodiment, the test device comprises a biasing element configured for biasing the at least one test pin towards a device under test to be tested using the test device. Such a biasing element may for instance be a spring. By biasing the test pin against a DUT, the contact may be improved and a cutting through an oxide layer on a contact of the DUT may be promoted.

In an embodiment, the method comprises, before directly contacting the electrically conductive structure of the device under test by the wedge-shaped end portion of the test pin, cutting through an oxide layer (which may be dielectric) on (i.e. covering) the electrically conductive structure by the wedge-shaped end portion. By taking this measure, the reliability of the electric contact and hence the reliability of the test result may be improved.

The above and other objects, features and advantages will become apparent from the following description and the appended claims, taken in conjunction with the accompanying drawings, in which like parts or elements are denoted by like reference numbers.

BRIEF DESCRIPTION OF THE DRAWINGS

The accompanying drawings, which are included to provide a further understanding of exemplary embodiments and constitute a part of the specification, illustrate exemplary embodiments.

In the drawings:

FIG. 1 shows a test device for testing a device under test according to an exemplary embodiment.

FIG. 2 shows a test device for testing a device under test with a cantilever test pin having an exchangeable pin tip body according to an exemplary embodiment.

FIG. 3 shows a test device for testing a device under test with cantilever test pins and exchangeable pin tip bodies according to an exemplary embodiment.

FIG. 4 shows test pins in pogo pin configuration according to an exemplary embodiment.

FIG. 5 shows exchangeable pin tip bodies of test pins according to exemplary embodiments.

FIG. 6 shows test pins and exchangeable pin tip bodies of test pins according to exemplary embodiments.

FIG. 7 shows a test device for testing a device under test with cantilever test pins according to an exemplary embodiment, wherein a common handling body is used for exchanging a set of pin tip bodies simultaneously.

DETAILED DESCRIPTION

Figure 8:
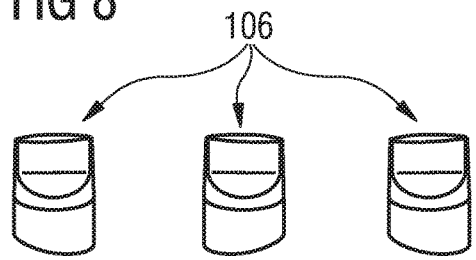
FIG. 8 shows test pins in wedge shape configuration according to an exemplary embodiment.

The illustration in the drawing is schematically and not to scale.

Before exemplary embodiments will be described in more detail referring to the figures, some general considerations will be summarized based on which exemplary embodiments have been developed.

In the following, a first aspect of the invention will be explained:

According to a corresponding embodiment, replaceable test contact tips are provided. This is in contrast to conventional approaches in which a whole contact pin has to be replaced when the tip is worn out. According to the described embodiment, a test contact pin is provided in which the tip is replaceable independently of the re-usable base structure after being worn out. This reduces the maintenance cost of tips and reduces the cycle time of changing tips. This renders the frequent change of the whole test contact pin unnecessary which need to be done conventionally when only the pin tip is worn out. This may reduce the conventionally high effort to change the whole contact pin by only replacing the tip of the contact pin (in particular there is no need to remove a contact pin from a comb). This may bring down the cost as it only replaces the tip of the pin which is cheaper. Such an architecture also allows to reduce the time required to change the pin configuration.

In one embodiment, a cantilever-type test pin is provided with replaceable pin tip body. In another embodiment, a pogo pin-type test pin is provided with replaceable pin tip body. More generally, the shape of the replaceable pin tip bodies and/or the re-usable base structures can be in any form. The material of the replaceable pin tip body can be any electrically conductive material, for instance copper.

Conventionally, test pins are provided as one-piece structures. Once worn out, the whole socket of a housing has to be dismantled to replace the test pin. In contrast to this, it may be sufficient according to an exemplary embodiment to take out the cover of the housing and replace the pin tip body without the need to dismantle the whole socket.

In the following, a second aspect of the invention will be explained:

According to a corresponding embodiment, it is possible to implement a wedge-shaped tip contact pin for semiconductor IC testing. This may allow to significantly reduce a false yield loss testing in test production, for the failure due to high contact resistance.

In test operation, an electrical contact between testers and devices under test is critical to the testing yield. Good units of DUTs can be rejected purely due to the high contact resistance between the test pins from the test device and leads from the devices being tested.

However, an improvement of the first pass yield is similar to a productivity improvement or a testing cost reduction.

Current contact pins have lower yield issue when testing μPPF-package devices or other IC devices. For the example of M1867B LQFP176-9, the yield loss may be about 5% to 10%, whereas the normal yield of tin-package device may be below 0.5% to 1%.

Conventionally, test production has to re-test the rejected units to avoid false failure. The disadvantages of re-test include more equipment time, higher material cost and labor cost. It is very advantageous if such false failure can be reduced or even minimized during the first time test.

By changing the contact pin tip geometry from traditional crown type to new wedge type, it has turned out that the pin tip has much better contact stability and reliability with the leads of a device under test. An improved penetration of an oxidation layer on the lead surface may be achieved with such a wedge type geometry according to an exemplary embodiment, which ensures a good contact between pin tip and lead surface beneath the oxidation layer. Consequently, it may become possible to improve first pass yield rate.

Correspondingly, a case study has been carried out based on M1867B which shows the causes of μPPF low yield issue:

μPPF lead surface is approximately 10 times harder than tin surface a contact area of μPPF is approximately 27% smaller than tin Hence, the improved pin tip design according to an exemplary embodiment of the invention has the ability to stay on a smaller target and cut through the harder surface to provide a good contact.

A crown type pin with four points tip is difficult to land on a μPPF surface steadily as the four points may not have the same height and the pin is rotatable inside the pin hole.

In constant to this, a wedge tip with sharp edge, as provided according to an exemplary embodiment, can penetrate the lead oxidation layer easy and moreover it is able to stay on the μPPF surface firmly.

According to an exemplary embodiment, the top of a pin tip is designed as knife edge, which is sharp enough to cut through a hard μPPF lead surface. Preferably, the angle of the pin tip edge can be controlled to be in a range between 60° and 100°. Such an angle should not be too sharp, otherwise the lifetime of the tip will be shortened. Furthermore, such a pin tip may have the sides cutting like two walls, which allows to hold the test pin's orientation constant during operation. The pin holder may have accommodation slots of a similar shape and size, which is to fix the test pin's orientation to increase reproducibility.

TABLE 1

| First pass yield (IC function test) comparison study of two types of pins | | | |
|---|---|---|---|
| Lead surface | Pin Type | First Pass Yield | Improvement |
| Matte Tin | Crown Wedge | 94.00% 98.50% | 4.50% |
| μPPF | Crown Wedge | 87.10% 95.00% | 7.90% |

Table 1 is based on a seven weeks testing result at production line, with total 84 k insertions. Table 1 clearly shows that the wedge shaped pin tip according to an exemplary embodiment can improve the first pass yield on μPPF packages significantly. The wedge shaped pin tip according to an exemplary embodiment can also improve the first pass yield on Matte Tin packages also.

At the same time, no deterioration of the mechanical yield has been found. No solderability concerns occurred for the wedge shaped pin. An analysis shows that a high lifetime can be obtained for the wedge pin.

FIG. 1 schematically shows a test device 100 for testing devices under test 102 (DUTs) by carrying out an electronic full function test according to an exemplary embodiment. The devices under test 102 may be IC (integrated circuit) devices, for instance semiconductor packages for high power applications.

The test device 100 comprises a housing 104 made of an electrically insulating material. A plurality of electrically conductive test pins 106 are assembled with and extend through the housing 104. The test pins 106 are configured for electrically contacting electrically conductive structures 130, such as pads or traces, of the device under test 102 for conducting, during the test, electric test signals from the test device 100 to the device under test 102, and from the device under test 102 back to the test device 100.

A control unit 108, which may be a microprocessor or the like, can be configured for applying the test signals via the test pins 106 to the device under test 102 as a stimulus. The control unit 108 may be further configured for detecting a response from the device under test 102 in response to the application of the test signals via the test pins 106. Based on the functionality of a device under test 102, a certain pattern of the response signals is expected when a certain device under test 102 works properly. Thus, an analysis of the response signals can be used as a basis for a decision as to whether the device under test 102 has passed the test and can therefore be considered as a good product which can be shipped to a customer, or whether the device under test 102 has failed the test. If the latter decision is taken, a further test can be carried out, the device under test 102 may be further processed, or may be thrown away.

As can be taken from FIG. 1, each of the test pins 106 comprises an electrically conductive base structure 112 (for instance made of copper) for electrically conducting a respective test signal between the device under test 102 and the test device 100. As a further separate body, each of the test pins 106 comprises an exchangeable electrically conductive pin tip body 114 (for instance made of copper) configured to directly contact the device under test 102 and to be exchangeably assembled with the base structure 112. The pin tip body 114 and the base structure 112 may be matched to one another to be assembled together by a form closure and/or by force transmission by friction. In particular, the pin tip body 114 may be simply plugged on the base structure 112. Preferably, the pin tip body 114 is configured as a wedge-shaped pin tip body, as shown in further detail in FIG. 8 to FIG. 10.

During operation, a distal end face of the pin tip bodies 114 is brought in contact with a respective counter-surface of an electrically conductive structure 130 of the device under test 102. The control unit 108 then generates test signals applied via supply lines 122 to some of the test pins 106 and from there to corresponding ones of the electrically conductive structures 130 of the device under test 102. In the interior of the device under test 102, these test signals result to a certain signal processing in accordance with the electronic functionality of the device under test 102. Consequently, a response signal is generated which is conducted back via a wedge-shaped pin tip body 114 and a response line 124 to the control unit 108. The control unit 108 can compare the pattern or characteristics of the response signal with an expected characteristics in case of a properly functioning device under test 102 and may then classify the device under test 102 as having passed or having failed the quality test. In view of the exchangeability of the pin tip bodies 114 independently of the permanently used base structures 112, only the elements of the test pins 106 being in direct contact with the electrically conductive structures 130 of the devices under test 102 during testing need to be exchanged, i.e. only the portions of the test pins 106 are exchanged which are prone to wear. This allows for a resource-efficient use of the test pins 106.

Moreover, the wedge-shaped configuration of the pin tip bodies 114 of the test pins 106 ensures a proper electric coupling between the test pins 106 and the electrically conductive structures 130 of the devices under test 102. This improves the reliability of the test result, i.e. that a device under test 102 classified as "passed" is particularly intact, and a device under test 102 classified as "failed" is particularly defective.

FIG. 2 shows a cross-sectional view of part of a test device 100 for testing a device under test 102 with cantilever type test pin 106 according to an exemplary embodiment.

According to FIG. 2, the pin tip body 114 comprises an annular collar 200 configured to be accommodated in a recess 202 formed between two members 204, 206 of housing 104 of the test device 100 for captively assembling the test pin 106 at the housing 104. The base structure 112, which mainly extends through an interior of member 204, is configured as a cantilever, but may alternatively also be configured as a pogo pin. The pin tip body 114 mainly extends through member 206 and protrudes beyond an upper surface thereof so as to be vertically exposed for properly contacting an electrically conductive structure 130 of device under test 102.

More specifically, FIG. 2 hence shows a configuration in which a substantially cup-shaped pin tip body 114 is combined with a cantilever-shaped base structure 112 with a substantially cylindrical end section 210 extending into a recess 218 at a proximal end portion 212 of the pin tip body 114.

A socket housing part (see member 204) and a socket cover part (see member 206) constitute the housing 104. These two housing members 204, 206 may be connected to one another by mounting screws 216 or other fasteners. For exchanging a worn-out pin tip body 114, the mounting screws 216 are removed and the housing member 206 is temporarily taken off. This provides access to the pin tip body 114 which can then be removed. Such a removal is mechanically impossible without previously removing the housing member 206 due to the form closure of the collar 200 in the recess 202 formed between the housing members 204, 206.

FIG. 3 shows a test device 100 for testing a device under test 102 with cantilever test pins 106 according to an exemplary embodiment. As can be taken from the test device 100 shown in FIG. 3, the architecture of separately exchangeable pin tip bodies 114 is applicable to a cantilever architecture of the base structures 112.

FIG. 4 shows test pins 106 in pogo pin configuration according to an exemplary embodiment. As can be taken from FIG. 4, the architecture of separable or substitutable pin tip bodies 114 is also applicable to a pogo pin configuration of the base structures 112. Pin tip bodies 114 with different geometries are shown, which are illustrated in further detail in FIG. 5. As indicated with reference numeral 400 in FIG. 4, the pogo pins may include a biasing element for biasing the corresponding test pin 106 towards a device under test 102 to be tested. Such a biasing element may for instance be a spring. By biasing the test pin 106 against a DUT, the contact may be improved and a cutting through an oxide layer on a contact of the DUT may be promoted. FIG. 5 hence shows exchangeable pin tip bodies 114 of test pins 106 according to exemplary embodiments. FIG. 5 particularly shows that the concept of exchangeable pin tip bodies 114 is applicable to very different geometries of such contact tips. As can be taken from reference numeral 500, they can have a semispherical external shape. As can be taken from reference numeral 510, they can have a sharp external shape. Furthermore, as can be taken from reference numeral 520, the contact surface of the exchangeable pin tip bodies 114 may even be round. Many other geometries are possible.

FIG. 6 shows test pins 106 and exchangeable pin tip bodies 114 of test pins 106 according to exemplary embodiments. FIG. 6 illustrates the slot fix concept for contact tips, i.e. the possibility to connect a pin tip body 114 to a base structure 112 by cooperation between a protrusion at a distal end of the base structure 112 and slot recesses at a proximal end of the pin tip bodies 114 engaging the protrusions.

FIG. 7 shows a test device 100 for testing a device under test 102 with cantilever test pins 106 according to an exemplary embodiment. More specifically, FIG. 7 shows a plurality of parallel aligned pin tip bodies 114 attached to a handling body 700 configured as an elastomer body. The test device 100 shown in FIG. 7 hence comprises a plurality of test pins 106 whose pin tip bodies 114 are connected with one another via handling body 700 for interaction with the housing 104. This allows to mount multiple pin tip bodies 114 on the handling body 700 allowing to exchange the plurality of pin tip bodies 114 simultaneously, i.e. in a batch procedure. Such a handling body 700 may be a stripe, for instance an elastomer stripe, and simplifies handling a plurality of pin tip bodies 114 to be exchanged at the same time. The handling body 700 can be made of a soft stretchable material. All contacts may be brought together at the same time, so that the exchange can be rendered faster.

FIG. 8 shows test pins 106 in wedge shape configuration according to an exemplary embodiment.

Figure 9:
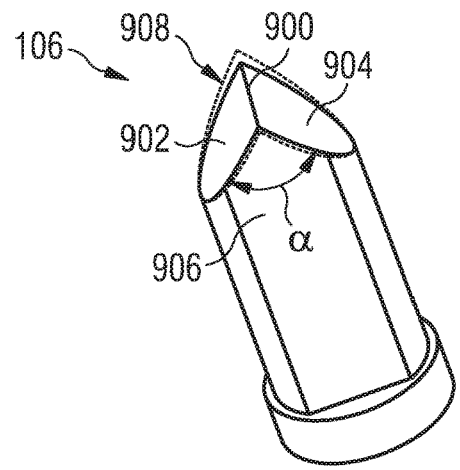
FIG. 9 shows a three-dimensional view of a test pin in wedge shape configuration according to an exemplary embodiment.
Figure 10:
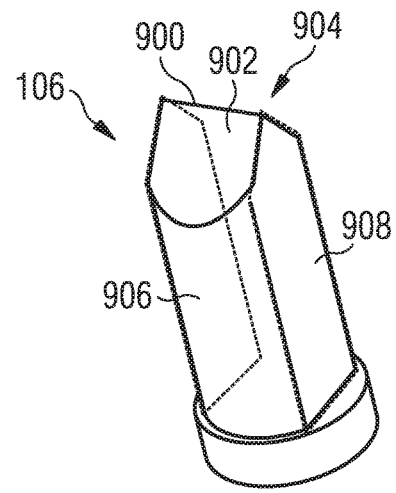
FIG. 10 shows another three-dimensional view of the test pin according to FIG. 9.

FIG. 9 shows a three-dimensional view of a test pin 106 in wedge shape configuration according to an exemplary embodiment. FIG. 10 shows another three-dimensional view of the test pin 106 according to FIG. 9.

As can be taken from FIG. 9 and FIG. 10, the wedge-shaped end portion of the test pin 106 comprises an end line 900 configured as a sharp knife edge or cutting edge. Furthermore, the wedge-shaped end portion comprises two planar slanted first walls 902, 904 tapering towards the end line 900. An angle α between the two slanted first walls 902, 904 is in a range between 60° and 100°. This combines synergistically a high wear resistance with an efficient cutting function. Moreover, the wedge-shaped end portion comprises two planar second walls 906, 908 extending in parallel to one another and slanted with regard to the two planar slanted first walls 902, 904.

In the three-dimensional view of FIG. 9, it is shown that the two planar first walls 902, 904 are slanted with regard to one another. When the angle α is selected to assume a value between 60° and 100°, both mechanical integrity and a sharp function of the end line 900 can be obtained. When the angle α falls significantly below 60°, excessive wear of the test pin 106 may occur. When the angle α significantly exceeds 100°, it may become difficult to penetrate through an oxide layer on a chip pad or any other electrically conductive structure 130 of a device under test 102. The end line 900 is configured as a cutting blade, i.e. is sharp.

With the parallel alignment of the second walls 906, 908, a high mechanical stability can be obtained. Furthermore, the configuration according to FIG. 9 prevents the pin from rotating. More specifically, the housing 104 and the test pins 106 shown in FIG. 9 and FIG. 10 are matched to one another so that rotation of the test pin 106 relative to the housing 104 is disabled during testing operation. Thus, the test pin 106 can be fixed to one location and one orientation which results in a better contactability.

Figure 11:
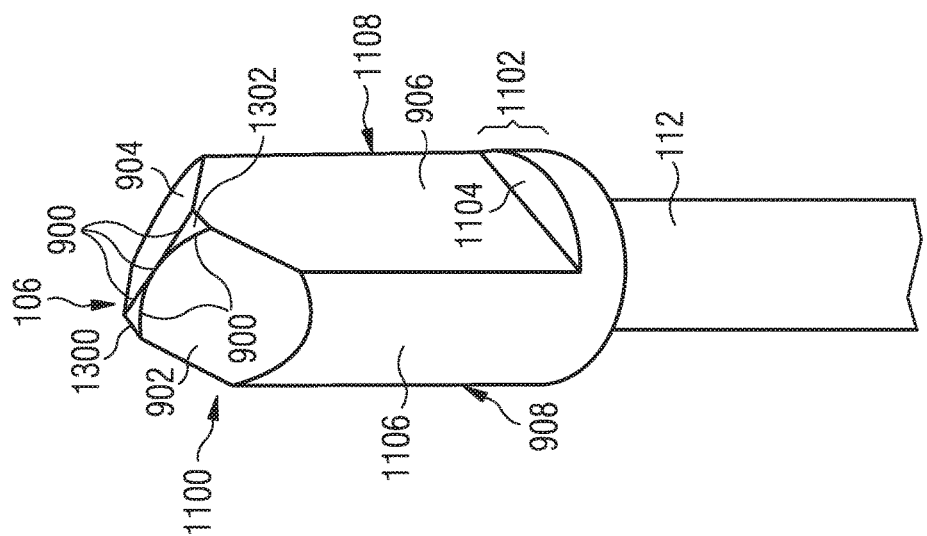
FIG. 11 to FIG. 13 shows test pins in wedge shape configuration according to exemplary embodiments.
Figure 12:
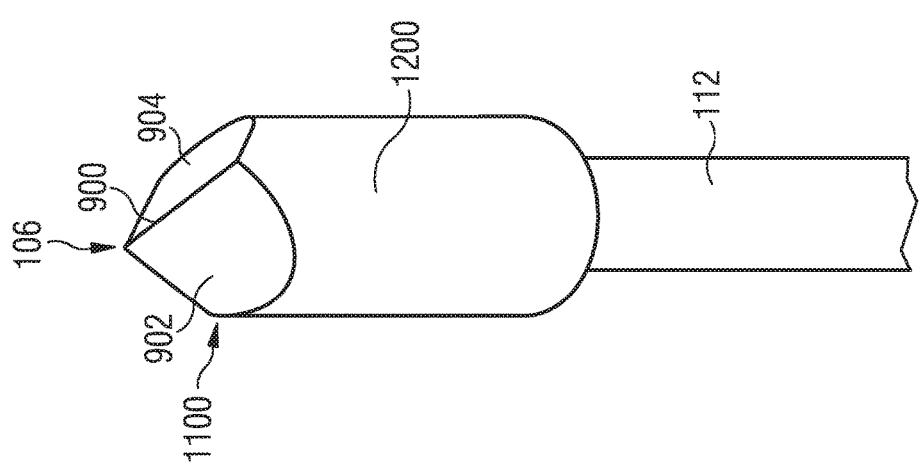
Figure 13:
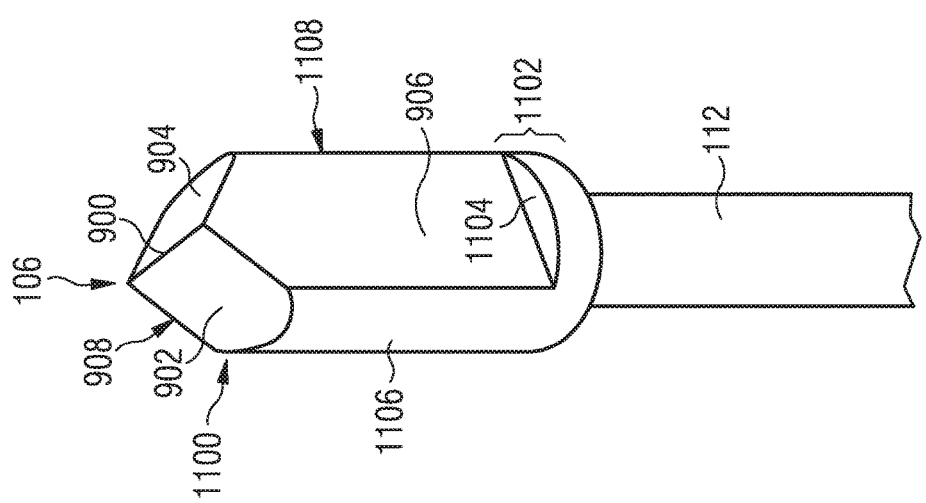

FIG. 11 to FIG. 13 shows test pins 106 in wedge shape configuration according to exemplary embodiments.

In the embodiment according to FIG. 11, pin tip 1100 is integrally connected with (alternatively substitutably attached to) base structure 112. In FIG. 11, base structure 112 is embodied as a circular cylindrical body. The pin tip 1100 has a circular cylindrical section 1102 with a planar horizontal surface portion 1104, configured as a step or platform. The circular cylindrical section 1102 has a larger radius than the circular cylindrical portion of the base structure 112. The circular cylindrical section 1102 is the mechanical interface between the base structure 112 on the one hand and a portion of the pin tip 1100 on the other hand, being delimited by the walls 902, 904, 906, 908 and by rounded wall portions 1106, 1108. According to FIG. 11, the end line 900 is straight.

In the embodiment according to FIG. 12, wall sections with reference numerals 1106, 1108, 906, 908 are replaced by a circular cylindrical structure with a round surface 1200 along the entire circumference extending up to the end line 900.

In the embodiment according to FIG. 13, the straight end line 900 according to FIG. 11 is replaced by a convex end portion comprising an end line 900 with a plurality of interconnected rounded sections and defining two substantially triangular end faces 1300, 1302. FIG. 13 hence shows that the top edge can be curved, like a nail shape. The width of the wedge can be inconsistent.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A test pin for a test device for electrically contacting a device under test to be tested, the test pin comprising:
   an electrically conductive base structure for electrically conducting a test signal between the device under test and the test device;
   an exchangeable electrically conductive pin tip body configured to directly contact the device under test and to be exchangeably assembled with the base structure;
   wherein the pin tip body comprises a collar configured to be accommodated in a recess formed between two members of a housing of the test device for captively assembling the test pin at the housing.

2. The test pin according to claim 1, wherein the pin tip body and the base structure are configured to be assembled by at least one of the group consisting of a form closure, and by force transmission by friction.

3. The test pin according to claim 1, wherein the pin tip body is configured to be plugged on the base structure.

4. The test pin according to claim 1, wherein the base structure is configured as one of the group consisting of a cantilever, and a pogo pin.

5. The test pin according to claim 1, wherein the pin tip body is configured as one of the group consisting of a wedge-shaped pin tip body, a crown-shaped pin tip body, and a rounded pin tip body.

6. A test pin for a test device for electrically contacting a device under test to be tested, the test pin comprising:
   an electrically conductive base structure for electrically conducting a test signal between the device under test and the test device;
   a pin tip configured as wedge-shaped end portion of the test pin and to directly contact the device under test for conducting the test signal between the device under test and the base structure;
   wherein the pin tip is configured as an exchangeable electrically conductive pin tip body configured to directly contact the device under test and to be exchangeably assembled with the base structure;
   wherein the pin tip body comprises a collar configured to be accommodated in a recess formed between two members of a housing of the test device for captively assembling the test pin at the housing.

7. The test pin according to claim 6, wherein the wedge-shaped end portion comprises an end line configured at knife edge, in particular one of the group consisting of a straight knife edge and a curved knife edge.

8. The test pin according to claim 6, wherein the wedge-shaped end portion comprises two slanted first walls tapering towards an end line.

9. The test pin according to claim 8, wherein an angle between the two slanted first walls is in a range between 60° and 100°.

10. The test pin according to claim 6, wherein the wedge-shaped end portion comprises two second walls extending in parallel to one another, in particular two vertical second walls.

11. A test device for electrically testing a device under test, the test device comprising:
    a housing;
    at least one test pin according to claim 1 or at least one test pin according to claim 6 assembled with the housing and configured for electrically contacting a device under test for conducting a test signal from or to the device under test.

12. The test device according to claim 11, comprising a control unit configured for applying the test signal via at least one of the at least one test pin to the device under test as a stimulus and detecting a response from the device under test to the test signal via at least one of the at least one test pin.

13. The test device according to claim 11, wherein the housing and the at least one test pin are matched to one another so that rotation of the at least one test pin relative to the housing is disabled when the at least one test pin is mounted at the housing.

14. The test device according to claim 11, comprising a plurality of test pins according to claim 1 whose pin tip bodies are connected with one another via a handling body for interaction with the housing to exchange the plurality of pin tip bodies simultaneously.

15. The test device according to claim 11, comprising a biasing element configured for biasing the at least one test pin towards a device under test to be tested using the test device.

16. A method of testing a device under test, the method comprising:
  directly contacting a test pin body of a test pin according to claim 1 with an electrically conductive structure of the device under test;
  applying a test signal via the electrically conductive base structure and the test pin body to the electrically conductive structure of the device under test as a stimulus;
  detecting a response of the device under test to the test signal;
  disassembling the exchangeable pin tip body from the base structure and assembling another exchangeable electrically conductive pin tip body with the same base structure.

17. A method of testing a device under test, the method comprising:
  directly contacting a wedge-shaped end portion of a test pin according to claim 6 with an electrically conductive structure of the device under test;
  applying a test signal via the electrically conductive base structure and the wedge-shaped end portion to the electrically conductive structure of the device under test as a stimulus;
  detecting a response of the device under test to the test signal.

18. The method according to claim 17, wherein the method comprises, before directly contacting the electrically conductive structure of the device under test by the wedge-shaped end portion of the test pin, cutting through an oxide layer on the electrically conductive structure by the wedge-shaped end portion.

* * * * *